United States Patent
Fautz et al.

(10) Patent No.: US 10,088,542 B2
(45) Date of Patent: Oct. 2, 2018

(54) MAGNETIC RESONANCE APPARATUS AND METHOD FOR THE OPERATION THEREOF

(71) Applicant: Siemens Aktiengesellschaft, Munich (DE)

(72) Inventors: Hans-Peter Fautz, Forchheim (DE); Dominik Paul, Bubenreuth (DE)

(73) Assignee: Siemens Aktiengesellschaft, Munich (DE)

(*) Notice: Subject to any disclaimer, the term of this patent is extended or adjusted under 35 U.S.C. 154(b) by 342 days.

(21) Appl. No.: 14/970,941

(22) Filed: Dec. 16, 2015

(65) Prior Publication Data

US 2016/0169997 A1    Jun. 16, 2016

(30) Foreign Application Priority Data

Dec. 16, 2014 (DE) .................. 10 2014 226 053

(51) Int. Cl.
*G01V 3/00* (2006.01)
*G01R 33/54* (2006.01)
*G01R 33/565* (2006.01)

(52) U.S. Cl.
CPC ......... *G01R 33/543* (2013.01); *G01R 33/565* (2013.01)

(58) Field of Classification Search
CPC .................................................. G01R 33/543
USPC ........................................ 324/314, 309, 318
See application file for complete search history.

(56) References Cited

U.S. PATENT DOCUMENTS

| 8,975,892 | B2* | 3/2015 | Flammang | G01R 33/543 |
|---|---|---|---|---|
| | | | | 324/307 |
| 2010/0002921 | A1 | 1/2010 | Fenchel et al. | |
| 2012/0161766 | A1 | 6/2012 | Harvey et al. | |
| 2013/0265044 | A1* | 10/2013 | Senegas | G01R 33/543 |
| | | | | 324/307 |
| 2015/0002149 | A1 | 1/2015 | Nehrke et al. | |
| 2015/0323637 | A1 | 11/2015 | Beck et al. | |

* cited by examiner

*Primary Examiner* — Louis Arana
(74) *Attorney, Agent, or Firm* — Schiff Hardin, LLP

(57) ABSTRACT

In a magnetic resonance facility and operating method for acquiring image data of a patient in a manner defined by acquisition parameters, the acquisition of the image data is preceded by the performance of at least one alignment operation for adjusting operating parameters of the magnetic resonance facility that influence acquisition conditions for the current patient. At least one result data item describing the result of the alignment used for an at least partially automatic determination of at least one acquisition parameter not relating to the pulse shape of a radio-frequency pulse to be used during the acquisition.

16 Claims, 1 Drawing Sheet

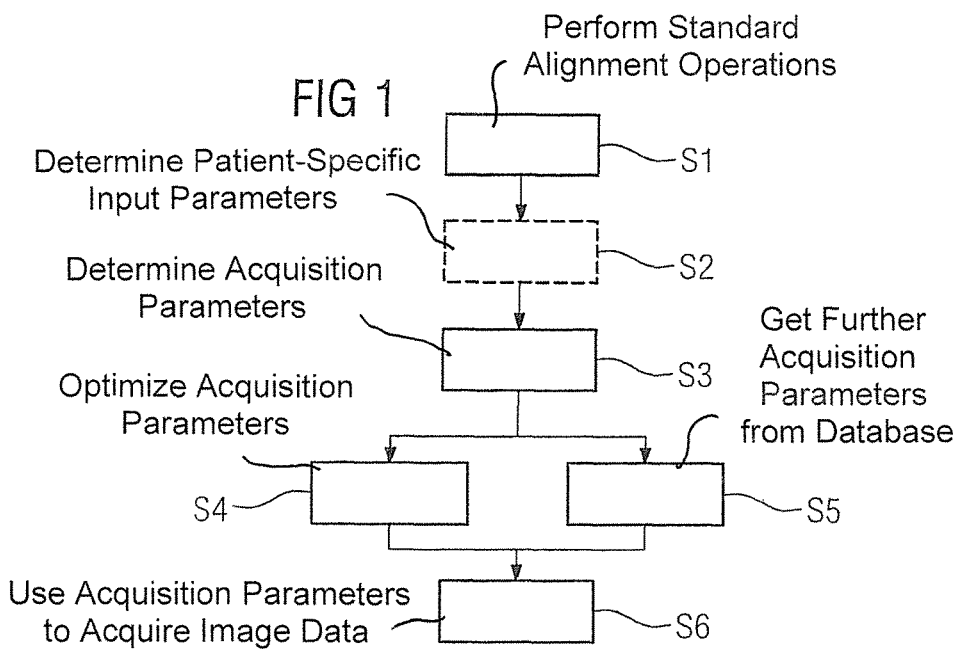
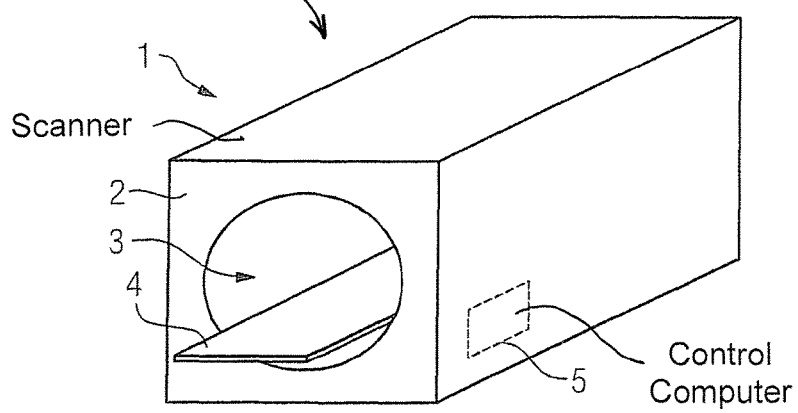

MAGNETIC RESONANCE APPARATUS AND METHOD FOR THE OPERATION THEREOF

BACKGROUND OF THE INVENTION

Field of the Invention

The invention relates to a method for operating a magnetic resonance facility for acquiring image data of a patient in a manner defined by acquisition parameters, the acquisition of the image data being preceded by the performance of at least one alignment operation for adjusting the operating parameters of the magnetic resonance facility that have an influence on the acquisition conditions for the current patient. The invention also relates to a magnetic resonance facility that is operated by such a method.

Description of the Prior Art

Magnetic resonance imaging has become a widely used standard, particularly in the field of medical engineering, as it allows a number of patients to be examined in very different ways. Depending on the purpose of the examination, there are a number of configuration and selection options for acquiring image data using a magnetic resonance facility. For example, it is possible to select defined magnetic resonance sequences to set a defined, desired, underlying contrast; a number of further acquisition parameters, which describe the actual acquisition operation, allow the acquisition process to be optimized in different magnetic resonance protocols for defined clinical questions and examination regions to be recorded.

A magnetic resonance facility requires the most homogeneous magnetic field possible in the imaging region. The introduction of patients can cause the previously homogeneous magnetic field to become distorted, leading to deterioration of the image quality. Also different transmitter voltages, which define the strength of the radio-frequency excitation to be brought about by radio-frequency pulses in the examination region, have to be selected for different patients, particularly with respect to their spread and/or limit values for electromagnetic exposure (SAR values). In order to adjust the operating parameters of the magnetic resonance facility defining acquisition conditions for specific patients who are to be examined, it is known to perform alignment operations before the actual acquisition of the image data.

To this end it is known, for example, to acquire B0 and B1 field maps, in other words basic magnetic field maps and/or radio-frequency magnet field maps, while a patient is already positioned for the acquisition, in order to improve shim measures for increasing the homogeneity of the respective magnetic fields. It is also known to perform an alignment operation with respect to the transmitter voltage. Alignment operations are also known with respect to the frequency of the radio-frequency excitation. In other words, patient-specific alignments are used to adjust the frequency, the basic magnetic field, and the transmitter voltage as precisely as possible for ideal acquisition conditions, for example a homogeneous B0 field. Operating parameters can be shim parameters, lower and/or upper limits for the transmitter voltage, etc.

After the alignment operations have been completed, specific effects of the patient are generally no longer considered. The magnetic resonance sequences or magnetic resonance protocols are generally designed to be so robust that expected variations in the acquisition conditions for different patients do not result in image quality degradation as far as possible. However, this is at the expense of acquisition efficiency and/or image quality. It is known for a user to perform patient-specific adjustments manually, but this becomes more time-consuming as magnetic resonance acquisition methods become more complex and an extensive understanding of the relationships is required, because multiple acquisition parameters can be set manually and can also interact with one another with respect to their impact. The operators of magnetic resonance facilities have to undergo extensive training and it takes a great deal of time to perform such patient-specific adjustments manually. It is also a problem that the adjustment options for the operator are limited to the acquisition parameters that can be accessed, because not all conceivable acquisition parameters, or those used, can be set, for example via operator's user interface. Finding an optimum solution manually by adjusting acquisition parameters is also generally no longer conceivable, because there is a complex, multidimensional parameter space, which no longer allows a sufficiently good overview.

It is known with parallel transmission (pTX) of the radio-frequency excitation pulses to calculate the pulse shape as a function of B0 and B1 maps determined during an alignment, and this is essential with pTX, because defined geometric distributions of the excitation have to be achieved during parallel transmission.

SUMMARY OF THE INVENTION

An object of the invention is to provide a simplified, at least partially automated, option for improving the adjustment of acquisition parameters for a specific patient who is to be examined.

This object is achieved according to the invention by, within a method of the type initially described, to use at least one result data item, that describes the result of the alignment, for an at least partially automatic determination of at least one acquisition parameter not relating to the pulse shape of a radio-frequency pulse to be used during the acquisition.

The invention is therefore based on the insight that the results of the alignment already provide information relating to the patient-specific acquisition conditions that have not been used to date, and to use at least one of those alignment result data items to allow more optimum acquisition parameters to be found semi-automatically, preferably fully automatically. In other words the available information relating to patient-specific acquisition conditions in the form of result data is used to optimize the acquisition parameters that should actually be used to acquire the image data, significantly beyond the conventional use of B0 and B1 field maps in pulse design during parallel transmission. It is also within the scope of the present invention to determine at least one acquisition parameter relating to the pulse shape of a radio-frequency pulse to be used during the acquisition as a function of the at least one result data item, for example, to adjust radio-frequency pulses for parallel imaging based on defined geometric, desired excitation patterns, in order to achieve defined slice shapes and so on. However the invention relates to the aspects that go beyond this and have hitherto not been used. For example, the at least one result data item can also contain information about the SAR reserves still present due to the transmitter voltage or coil charge, whether adiabatic pulses have to be used, whether certain types of magnetic resonance sequences can be used at all, etc. Result data from alignment operations also allows a determination as to which frequency bandwidths should be used, for example as a function of the homogeneity of the B0 field, and also allows certain aspects of the actual acquisition operation for the image data to be selected. These include, for example the above-mentioned selection of magnetic resonance sequences based on their sensitivity to B0 and/or B1 variations, as can be described by result data in the form of field maps, the selection of radio-frequency pulses to be used, such as whether adiabatic, non-adiabatic, amplitude-modulated and/or other radio-frequency pulses are to be used, the selection of suitable preparation methods, in particular fat saturation methods, etc. As well as these selection decisions, and in some instances with selection decisions made manually in advance that are also reflected in acquisition parameters, result data for alignment operations, as mentioned, also allows acquisition parameters of such selected magnetic resonance sequences, radio-frequency pulses, preparation methods and so on to be adjusted in a patient-specific manner, in other words with patient-specific optimization.

Thus the present invention generally allows the magnetic resonance acquisition, particularly at a sequence level, to be optimized automatically with respect to acquisition time, image quality and so on based on patient-specific information obtained during alignment operations.

Such optimization operations can also advantageously be integrated in software frameworks used for the control of the magnetic resonance facility, allowing patient-specific adjustment of the current examination strategy. Such a software layer is known for example in the form of the DOT framework (DOT=daily optimized throughput). In the context of such user interfaces the result data also supplies useful further information, in order, for example, to optimize a number of individual acquisition operations as part of an overall examination.

In the context of the present invention, the alignment operation performed can be a shim operation, with respect to the basic magnetic field and/or radio-frequency fields to be used for excitation and/or an adjustment of the transmitter voltage. Of course this list is not exhaustive, and result data can also be determined in the context of an alignment operation, for example by other measurements of B0 field maps and B1 field maps, which do not necessarily aim toward shimming. It can be seen from such examples that a field map determined in the context of the alignment operation and/or newly measured after the alignment operation, in particular a B0 field map and/or a B1 field map, can be used as result data. Also a determined or set transmitter voltage represents relevant information, because it can be determined, for example, how much of a SAR reserve is still present and so on. Operating parameters are of course generally also usable as result data.

In an embodiment of the invention, further patient-specific input parameters are taken into account in addition to the result data when determining the at least one acquisition parameter. It is therefore possible to use further existing and/or retrievable information to optimize the acquisition parameters further for a defined patient. For example, at least one input parameter, which can be determined based on the radio-frequency coils present and that describes the electromagnetic exposure of the patient or a margin still remaining for the electromagnetic exposure of the patient, can be used as a further patient-specific input parameter. It is possible to derive from such input parameters, for example, how high the amplitudes of radio-frequency pulses can be and/or what type of or generally how many radio-frequency pulses in total can be used, and so on.

It is further possible for cooperation information describing the willingness of the patient to cooperate and/or patient movements that occur, to be used as patient-specific input parameters. Different magnetic resonance sequences, for example, require the patient to move as little as possible, so such cooperation information can be considered when selecting the magnetic resonance sequence to be used. It is also possible to adapt existing magnetic resonance sequences specifically so that improved movement compensation is achieved and/or to select and/or recommend additional movement compensation modules automatically based on the cooperation information.

At least one physiological information item, in particular a physiological information item relating to the breathing and/or heartbeat of the patient, can also be used as a further patient-specific input parameter. Such information can be extremely helpful with respect to magnetic resonance sequences of the type that take account of periodic operations, for example in the context of time-of-flight angiography. Physiological information is also useful when setting navigators; it is also possible to estimate in advance whether, for example, magnetic resonance sequences and preparation methods are actually suitable for acquiring image data for patients who are subject to arrhythmias and/or breathing problems.

In the examples cited above for further patient-specific input parameters in particular, as well as in the examples below, it is expedient to use such examples in conjunction with the at least one result data item from the alignment operations. For example, homogeneity information available from a B0 field map can be used in conjunction with cooperation information describing patient movement and/or physiological information, to provide an overall assessment with respect to the robustness of a magnetic resonance sequence, preparation method etc.

Another example of further patient-specific input parameters that can be used in the context of the present invention is the use of the patient-specific input parameters acquired in advance from existing image data records of the patient. It is possible to use at least one image data record of the patient that was previously acquired using the same magnetic resonance facility as will be used for the current examination, in particular a localizer scan and/or an image data record from a previous examination, and/or to use an image data record previously acquired from a different imaging facility. Taking into account localizers of the type that are conventionally obtained for other purposes, for example together with result data from alignment operations, has proved to be a useful basis for adjusting acquisition parameters in accordance with the invention. While the results from localizers are conventionally generally used only for positioning slices of the patient from which image data are to be acquired, they frequently also contain further information that can be used expediently to select and/or adjust acquisition parameters. For example, the selection of the magnetic resonance sequence itself can take place based on a localizer; it is also conceivable to derive further information such as the fat component or the like from a localizer. Useful information for parameterizing the acquisition of image data for a patient can also be supplied by previous magnetic resonance examinations on the patient, hence the previous image data record, can relate to such an examination. If manual optimization has been performed in this context, the findings from then can be used for suitable acquisition parameters, for example, or can be used as a basis for further optimization.

As mentioned above with reference to several examples, the use of the at least one result data item (and optionally further patient-specific input parameters) is particularly advantageous primarily for selecting and/or excluding defined components of the acquisition operation. The evaluation of the at least one result data item can thus assist in selecting the radio-frequency pulses to be used and/or to exclude defined radio-frequency pulses from use. The same applies to magnetic resonance sequences, preparation methods, in particular fat saturation methods, and so on.

In an embodiment of the present invention, at least one of the acquisition parameters to be determined as a function of the at least one result data item is determined by an optimization operation in respect of a target function describing at least one optimization target. Conventional optimization algorithms can therefore be used to find suitable acquisition parameters for a defined patient, it being possible expediently to use the shortest possible acquisition time and/or the lowest possible electromagnetic exposure for the patient. In particular, at least one minimum global and/or local SAR value, and/or the highest possible image quality, such as with respect to resulting contrasts, can be as the optimization target. Boundary conditions can of course also be set within the optimization algorithm, so that, for example, at least one boundary condition that describes a maximum electromagnetic exposure for the patient, and/or a restriction relating to the components of the magnetic resonance facility, can be taken into account during the optimization operation. Therefore, regulatory limits for example can be taken into account with basic conditions, for example for the SAR value or peripheral nerve stimulation, as well as hardware restrictions, for example maximum or minimum performances. The optimization algorithm can be numerical and/or analytical, depending on the flexibility of the optimization task.

In a version of this embodiment, acquisition properties can be calculated in advance from predefined acquisition parameters, that include the at least one acquisition parameter to be optimized, using the Bloch equations. A value for the target function is determined therefrom. If an analytical solution is possible, the Bloch equations can be solved directly, but approximate calculations and/or simulations using the Bloch equations are also conceivable for simulating the acquisition properties in the acquisition conditions described by the at least one result data item. Ideally, the at least one result data item predefines the patient-specific acquisition conditions, on the basis of which, using the Bloch equations, it is possible to determine acquisition properties that are used in the target function.

In a preferred embodiment of the invention, at least one deviation from the optimum is permitted in the context of the optimization, in particular for at least one optimization target. The optimization is terminated when an intermediate result within each of the at least one deviations is reached. In this context the deviations can be understood to be a form of quality target, with the goal being not to find the absolutely optimum value for the acquisition parameters to be optimized, but instead to terminate the optimization before this point. This has the advantage that the resulting solution is made more robust by allowing variations of the acquisition conditions to still occur to a tolerable degree.

The aforementioned deviation can describe a permitted flip angle variation and/or a permitted slice curvature and/or a permitted deviation from a desired slice profile and/or permitted distortion of the magnetic field and/or permitted distortion in the image data and/or a permitted signal dephasing and/or a permitted deviation from a desired contrast property. The predefined quality targets for the acquisition of the image data for the patient can therefore include for example a maximum flip angle variation, slice curvature, a defined slice profile, permitted distortion, permitted signal dephasing, permitted contrast variations and so on, which can be predefined in a spatially limited manner, be constant over the imaging region or can also vary spatially.

If, for example, all the permitted deviations have already been achieved, apart from one defined permitted deviation, the optimization can be continued specifically with respect to the quality target that has not yet been met.

This generally allows a type of "quality-controlled optimization" to be achieved. This can generally also be used independently of the use of the result data item, although result data supplies excellent background knowledge relating to the patient-specific acquisition conditions, as described above. In one example with result data in the form of a defined B0 field map, a radio-frequency pulse can be calculated such that a permitted deviation (quality target) in the form of a predefined slice curvature is not exceeded. In order to achieve the best possible contrast, the maximum flip angle that such a radio-frequency pulse can have is calculated so that the magnetic resonance sequence does not exceed SAR limit values. Higher flip angles can generally be achieved with homogeneous B0 distribution, as the slice curvature imposes less stringent requirements on bandwidth and therefore SAR.

Independently of the use of quality targets, an advantageous example of the embodiment of the inventive method with an optimization operation results when the readout bandwidth, and therefore the signal to noise ratio (SNR) of a TrueFISP magnetic resonance sequence, are optimized by taking into account the banding artifacts to be expected as a result of the B0 distribution described by the result data. Banding artifacts refer to imaging errors, which result from the fact that with certain B0 field distributions, defined frequency bands do not supply a signal with TrueFISP magnetic resonance sequences. In such an exemplary embodiment therefore, the at least one result data item, in this case a B0 field map, is used to optimize an acquisition parameter, specifically the readout bandwidth, which does not relate to the pulse shape.

More complex embodiments than the examples cited herein are of course also conceivable, for example with multiple acquisition parameters being optimized based on result data, and optionally also based on further patient-specific input parameters.

As well as using an optimization operation, or even as an alternative to such an optimization operation, in a further embodiment of the invention at least one of the at least one acquisition parameters, to be determined dependent on the at least one result data item, is determined using a database. This approach ultimately permits a type of "empirical optimization", with which it is possible, for example, to determine optimized acquisition parameters by measurements for a series of characteristic acquisition conditions. It is then possible to compare the current, measured acquisition conditions described by the at least one result data item and optionally further patient-specific input parameters with different acquisition conditions stored in the database, for which optimum acquisition parameters are known and stored. It is therefore conceivable, when using a database that assigns acquisition parameters to result data, for the acquisition parameters to be determined by empirical optimization, in particular based on measurements performed using a number of subjects and/or patients. In some embodiments of the invention it is also conceivable to extend an existing database, for example with input on the part of an operator of the magnetic resonance facility, if the operator finds acquisition parameters that are particularly suitable for the documented acquisition conditions, for example by manual optimization, so that the database can also be extended and improved in this manner.

It is also within the context of the present invention for at least one comparison data record of the patient, who has already been positioned for image data acquisition, to be acquired in at least one advanced measurement using a predefined comparison acquisition parameter set. The comparison data record is compared, with regard to at least one image property, with database data records stored in a database, to which database acquisition parameter sets are assigned in each instance. A database acquisition parameter set is then selected as a function of the comparison. It is therefore also possible to describe acquisition conditions by image properties from comparison measurements, to which defined sets of acquisition parameters are assigned in each instance. In an embodiment, for example, at least one patient-specific type of movement artifact is used as the image property to be compared, and/or a localizer of the patient is used as the comparison data record. It is thus possible to determine the acquisition strategy for subsequent measurements using the comparison of movement artifacts in a localizer acquisition, if acquisition parameters for similar movement artifacts are already available in the database.

In addition to the method the invention, also concerns a magnetic resonance facility (apparatus), having a control computer configured the magnetic resonance apparatus so as to perform the inventive method. All the details relating to the inventive method can be applied in the same manner to the inventive magnetic resonance facility, with which the advantages cited above can therefore also be achieved.

It should also be noted here that it is preferable for the inventive method to be performed fully automatically, at least with respect to the determination of the acquisition parameters as a function of a result data item, such as with the acquisition parameters determined in this manner to be offered initially simply as suggestions, which then have to be confirmed by the operator of the magnetic resonance facility.

BRIEF DESCRIPTION OF THE DRAWINGS

FIG. 1 is shows a flowchart of an exemplary embodiment of the inventive method.

FIG. 2 schematically illustrates an inventive magnetic resonance facility.

DESCRIPTION OF THE PREFERRED EMBODIMENTS

FIG. 1 is a flowchart of an exemplary embodiment of the inventive method for operating a magnetic resonance facility for acquiring image data of a patient. In a step S1 standard alignment operations are first performed, in particular the setting of the transmitter voltage and the setting of shim parameters as operating parameters of the magnetic resonance facility, resulting in particular in defined field distributions, which are described by a B0 field map and a B1 field map. The transmitter voltage, the field maps and optionally further result data emerging from alignment operations and describing the resulting acquisition conditions during subsequent image data acquisition are stored in a storage facility of a control facility of the magnetic resonance facility, which automatically performs the method described herein.

In an optional step S2 further, patient-specific input parameters can be determined for a subsequent, automatic determination of improved acquisition parameters for the acquisition of the image data. It is possible here to determine for example input parameters relating to reserves in respect of the electromagnetic exposure of the patient, cooperation information describing the willingness of the patient to cooperate, physiological information, which may relate for example to the breathing and/or heartbeat of the patient, and/or before image data records for the patient as further patient-specific input parameters, the before image data records in the present instance including localizers and/or further before image data records for the patient acquired using a magnetic resonance facility.

Based on the result data determined in step S1 as a result of the alignment operation and optionally the further patient-specific input parameters determined in step S2 it is intended in a step S3 automatically to determine optimum acquisition parameters for the acquisition of the image data, it being possible for the determination of said acquisition parameters, which do not include acquisition parameters relating to the pulse shape of a radio-frequency pulse to be used, in the present instance also to include the selection and/or the exclusion of magnetic resonance sequences, preparation methods and/or radio-frequency pulses. For example it can be decided that certain fat saturation methods cannot be used as preparation methods for the present patient, with the same obviously also applying to T2 preparation methods and so on for example. If it is decided that the B0 variations are too great based on the result data, TrueFISP magnetic resonance sequences cannot be used, so they can be excluded for example.

In the present exemplary embodiment of the inventive method, two variants specifically are used in a parallel or consecutive manner, to determine acquisition parameters as a function of the result data (and optionally the further patient-specific input parameters). In a step S4 an optimization algorithm is used, which, as known in principle, uses a target function (cost function) describing optimization targets. Optimization targets here are the shortest possible acquisition time, the lowest possible electromagnetic exposure for the patient and the highest image quality possible. Basic conditions are also considered, in the present instance a maximum permissible electromagnetic exposure for the patient (SAR limit value) and restrictions relating to the components of the magnetic resonance facility, in particular exposure limits and operating intervals. Because the result data (and optionally the further patient-specific input parameters) describe the acquisition conditions together with other information relating to the use of the magnetic resonance facility very precisely, acquisition properties can be determined for a defined test set of acquisition parameters using the Bloch equations, for example by simulation and/or in particular approximate resolution of the Bloch equations. These acquisition properties ultimately define a value of the target function.

In the present instance the optimization algorithm used in step S4 is modified such that it does not push the optimization operation to the absolute optimum but simply complies with defined quality targets. These quality targets can be described by permitted deviations from the optimum, preferably for each optimization target, as well as indirectly. In the present instance it is possible to use a permitted flip angle variation (for example maximum 3%), a permitted slice curvature, a permitted deviation from a desired slice profile (for example a maximum 5% distortion of the slice shape), permitted distortions and/or other artifacts in the image data and a permitted deviation from a desired contrast property as quality targets. Ultimately it is verified in each optimization step whether the permitted deviations have already been reached, with optimization optionally being continued until the remaining deviations are eliminated.

Termination takes place, improving performance, therefore not when an absolute optimum is reached but when all the quality targets have been achieved. This provides a more robust solution.

Further acquisition parameters are determined from a database as a function of the result data in a step S5 performed parallel to step S4. In the database acquisition parameters are assigned to acquisition conditions described by the result data, optionally also directly to the result data. These acquisition parameters were determined by empirical optimization based on measurements performed on a number of subjects and/or patients. The comparison of the acquisition properties can also relate to image properties, which can be derived at least partially from the localizer acquisitions mentioned above and can be compared with stored image properties of comparison data records in order to find suitable acquisition parameters.

It is also possible to perform step S5 before step S4 in order to determine acquisition parameters that can be used for broader classes of acquisition conditions from a database, these then being able to serve as a basis for the optimization of acquisition parameters that are to be set more specifically.

Generally, therefore, a set of optimum acquisition parameters to be used is determined automatically from the result data (and optionally the further patient-specific input parameters), being used in a step S6 for acquiring the image data for the patient, optionally after confirmation by an operator.

The possibilities offered by the present invention will be explained again using the specific example of optimization with desired fat saturation. In this context the result data can be in particular B0 field maps, optionally also B1 field maps. These field maps can in particular be determined arithmetically after setting the shims and taking the same into account and/or can be obtained by new measurement. It is of course also possible to determine regions of interest for the result data or even to allocate a spatial priority distribution to the result data, for example assigning a particularly high value to optimization in regions where diagnostic image data is required.

The B0 field maps are known to describe deviations from homogeneity, which are also referred to as off resonances. This result data can now be evaluated differently in order to optimize the acquisition operation.

An acquisition strategy can first be determined or recommended, for example whether actual fat saturation is actually possible or if other methods, for example Dixon methods, should preferably be used. While Dixon methods may require a longer acquisition time and/or reconstruction time, methods using suppression or saturation pulses are generally much more sensitive to B0 inhomogeneities, so criteria can be set which evaluate the B0 field map, optionally taking into account spatial prioritization, in order to select Dixon methods or fat saturation methods based on this result data.

If spectral fat saturation pulses are used, for which, as described above, pulse selection can also take place as a function of the result data, these can also be optimized as a function of the result data, as already mentioned in relation to general radio-frequency pulses. Acquisition parameters to be optimized can comprise the center frequency, the frequency bandwidth and the flip angle here. The same also applies when using adiabatic radio-frequency pulses, for example SPAIR pulses, in the context of fat saturation, for which the amplitude, the frequency response and/or the bandwidth can be optimized.

In the context of the fat saturation example set out here provision is particularly advantageously made to determine a quality map ("accuracy map") describing the quality of fat saturation with spatial resolution taking into account the result data, specifically therefore the B0 field map and optionally the B1 field map, and the selected acquisition parameters. Such a quality map, for the calculation of which all the necessary information is available, estimates beforehand how effectively and where fat saturation will operate. It therefore contains information about residual inaccuracies, which can be a useful aid for an operator.

It should also be noted that such a concept can also be extended to other applications, for example other preparation methods, in particular also to parameters that generally describe measurement accuracy. In such an instance a quality map is determined and displayed using the result data and the acquisition parameters so that on the one hand the quality of the optimization is evident and on the other hand any remaining problem areas can be identified.

FIG. 2 shows an outline of an inventive magnetic resonance apparatus 1. As known in principle, it has a scanner 2 with a basic field magnet and a patient receiving receptacle 3, into which a patient can be introduced on a patient bed 4. Surrounding the patient receiving receptacle 3 are a gradient coil arrangement and a radio-frequency coil arrangement, which are not shown for clarity. Local coils can of course also be used for imaging. Shim coils, which can be parameterized as part of the alignment operation, to permit the most homogeneous B0 field and optionally also B1 fields possible, are also not shown for clarity.

Operation of the scanner 2 of the magnetic resonance apparatus 1 is controlled by a control computer 5, which is configured to perform the inventive method. A result data determination module of the computer 5 can retrieve the results of an alignment operation and store the result data for further use. An input parameter determination module of the computer 5 for determining further patient-specific input parameters is also optionally provided. A first number of the acquisition parameters to be optimized can be determined in an optimization unit by performing step S4; a second number of the acquisition parameters to be determined can be determined according to step S5 in a database interface, which has access to the database stored in the control computer 5 or an external computation facility. An acquisition module of the computer 5 uses the determined (and optionally permanently predefined and/or manually set) acquisition parameters ultimately to acquire the image data.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance apparatus comprising a magnetic resonance scanner comprising a radio-frequency antenna and a computer configured to operate the magnetic resonance scanner to acquire diagnostic magnetic resonance data from a subject by executing a magnetic resonance data acquisition sequence that includes radiation of a radio-frequency pulse, having a pulse shape, from said radio-frequency antenna, and wherein said magnetic resonance scanner comprises a basic field magnet that generates as a basic magnetic field during said acquisition of diagnostic magnetic resonance data from the subject, and said radio-frequency pulse has a radio-frequency field associated therewith, said method comprising:

prior to operating said magnetic resonance scanner to acquire said diagnostic magnetic resonance data from the subject, operating said magnetic resonance scanner with said computer in an alignment procedure wherein operating parameters of said magnetic resonance scanner are adjusted that influence acquisition conditions for acquiring said diagnostic magnetic resonance data from the subject, and in said alignment procedure, performing shimming of at least one of said basic magnetic field and said radio-frequency field, and generating a field map of said at least one of said basic magnetic field and said radio-frequency field that has been shimmed;

in said computer, at least partially automatically determining at least one acquisition parameter, that does not relate to said pulse shape of said radio-frequency pulse, from said field map; and in said computer, generating control signals, that include a representation of said at least one acquisition parameter, and emitting said control signals from said computer to said magnetic resonance scanner and operating said magnetic resonance scanner with said control signals, including operating said magnetic resonance scanner according to said at least one acquisition parameter, so as to acquire said diagnostic magnetic resonance data from the subject.

2. A method as claimed in claim 1 comprising providing said computer with patient-specific input parameters that are specific to said subject, and, in said computer, using said patient-specific input parameters together with said at least one alignment result data item to determine said at least one acquisition parameter.

3. A method as claimed in claim 2 comprising selecting said patient-specific input parameter as an electronic designation of a parameter selected from the group consisting of a permitted electromagnetic exposure of the subject, an ability or willingness of the subject to cooperate with the acquisition of said diagnostic magnetic resonance data, a movement of the subject that is expected to occur during the acquisition of said diagnostic magnetic resonance data, physiological information relating to breathing activity of the subject, physiological information relating to the heartbeat of the subject, and an image data record acquired from the subject.

4. A method as claimed in claim 2 wherein said patient-specific input parameter is an image data record of the subject, selected from the group consisting of an image data record acquired from the subject using said magnetic resonance scanner, an image data record acquired from the subject using the magnetic resonance scanner prior to said alignment procedure, an image data record acquired from the subject of a localizer scan, and an image data record acquired from the subject using a magnetic resonance scanner other than said magnetic resonance scanner.

5. A method as claimed in claim 1 comprising determining said at least one acquisition parameter as a function of said at least one alignment result data item by executing an optimization algorithm in said computer, said optimization algorithm comprising a target function that systematically seeks to achieve at least one optimization target.

6. A method as claimed in claim 5 wherein said optimization target is selected from the group consisting of a shortest possible acquisition time for acquiring said diagnostic magnetic resonance data from the subject, a lowest possible electromagnetic exposure of the subject during the acquisition of said diagnostic magnetic resonance data from the subject, a global specific absorption rate (SAR) value, a local SAR value, a highest possible image quality of an image produced from the diagnostic magnetic resonance data acquired from the subject, and a highest possible contrast in an image of the subject generated from said diagnostic magnetic resonance data.

7. A method as claimed in claim 5 comprising, in said optimization algorithm, setting at least one boundary condition selected from the group consisting of a maximum electromagnetic exposure that is permitted for the subject, and a restriction in hardware or operation of said magnetic resonance scanner that is dependent on a maximum electromagnetic exposure that is permitted for the subject.

8. A method as claimed in claim 5 comprising executing said optimization algorithm using the Bloch equations to obtain a value for said optimization target, also using predetermined acquisition parameters provided to said computer.

9. A method as claimed in claim 5 comprising executing said optimization algorithm to permit a predetermined degree of deviation from said optimization target, and terminating said optimization algorithm when said optimization target, calculated by executing said optimization algorithm, is within said predetermined degree of deviation.

10. A method as claimed in claim 9 wherein said permitted degree of deviation is selected from the group consisting of a permitted flip angle deviation, a permitted slice curvature, a permitted deviation from a predetermined slice profile, a permitted distortion of a basic magnetic field generated by said magnetic resonance scanner, a permitted deviation in a quality of image data generated from said diagnostic magnetic resonance data, a permitted signal dephasing that occurs during the acquisition of said diagnostic magnetic resonance data, and a permitted deviation from a contrast in an image of the subject generated from said diagnostic magnetic resonance data.

11. A method as claimed in claim 1 comprising, from said computer, accessing a database and using information from said database, together with said at least one alignment result data item, to determine said at least one acquisition parameter.

12. A method as claimed in claim 11 wherein said database comprises information acquired from a population of a plurality of subjects each having a set of acquisition parameters respectively associated therewith in said database, and wherein said computer implements an empirical optimization algorithm based on said information access from said database, together with said at least one alignment result data item, to determine said at least one acquisition parameter.

13. A method as claimed in claim 11 comprising positioning said subject in said magnetic resonance scanner for acquiring said diagnostic magnetic resonance data and, after positioning said subject in the magnetic resonance scanner, acquiring a comparison data record from the subject in the magnetic resonance scanner and accessing, from said database, a database data record of the subject that is stored in the database together with associated acquisition parameters and, in said computer, comparing said comparison data record of the subject with said database data record to obtain a comparison result, and setting at least one acquisition parameter for acquiring said diagnostic magnetic resonance data from the subject dependent on said comparison result.

14. A method as claimed in claim 13 wherein said database data record designates a movement artifact at that is specific to said subject and wherein said comparison result designates an image quality of the subject that is to be expected in an image of the subject generated from the diagnostic magnetic resonance data.

15. A method as claimed in claim 13 comprising acquiring said comparison data record of the subject by executing a localizer scan of the subject in said magnetic resonance scanner.

16. A magnetic resonance apparatus comprising:
a magnetic resonance scanner comprising a radio-frequency antenna and a basic field magnet that generates a basic magnetic field;
a computer configured to operate the magnetic resonance scanner to acquire diagnostic magnetic resonance data from a subject by executing a magnetic resonance data acquisition sequence that includes radiation of a radio-frequency pulse, having a pulse shape, from said radio-frequency antenna, said radio-frequency pulse having a radio-frequency field associated therewith;
said computer being configured to execute an alignment procedure prior to operating said magnetic resonance scanner to acquire said diagnostic magnetic resonance data from the subject, by operating said magnetic resonance scanner in said alignment procedure to adjust operating parameters of said magnetic resonance scanner that influence acquisition conditions for acquiring said diagnostic magnetic resonance data from the subject, and in said alignment procedure, said computer being configured to perform shimming of at least one of said basic magnetic field and said radio-frequency field and to generate a field map of said at least one of said basic magnetic field and said radio-frequency field that has been shimmed;
said computer being configured to at least partially automatically determine at least one acquisition parameter, that does not relate to said pulse shape of said radio-frequency pulse, from said field map; and
said computer being configured to generate control signals, that include a representation of said at least one acquisition parameter, and to emit said control signals from said computer to said magnetic resonance scanner and to operate said magnetic resonance scanner with said control signals, including operating said magnetic resonance scanner according to said at least one acquisition parameter, so as to acquire said diagnostic magnetic resonance data from the subject.

\* \* \* \* \*